United States Patent
Chang et al.

(10) Patent No.: US 8,910,097 B2
(45) Date of Patent: Dec. 9, 2014

(54) NETLIST ABSTRACTION

(71) Applicant: Synopsys, Inc., Mountain View, CA (US)

(72) Inventors: Douglas Chang, San Jose, CA (US); Balkrishna R. Rashingkar, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/849,430

(22) Filed: Mar. 22, 2013

(65) Prior Publication Data

US 2014/0189620 A1    Jul. 3, 2014

Related U.S. Application Data

(60) Provisional application No. 61/747,969, filed on Dec. 31, 2012.

(51) Int. Cl.
*G06F 9/45* (2006.01)
*G06F 17/50* (2006.01)

(52) U.S. Cl.
CPC .................................. *G06F 17/505* (2013.01)
USPC .......................................... 716/103; 716/119

(58) Field of Classification Search
USPC ........................................................ 716/103
See application file for complete search history.

(56) References Cited

U.S. PATENT DOCUMENTS

| | | | |
|---|---|---|---|
| 7,266,796 B1 | 9/2007 | Chu et al. | |
| 7,437,695 B1 | 10/2008 | Ranjan et al. | |
| 8,104,000 B2 | 1/2012 | Bjesse | |
| 8,434,042 B2 | 4/2013 | Ishikawa | |
| 2005/0198601 A1* | 9/2005 | Kuang et al. | 716/6 |
| 2007/0245281 A1* | 10/2007 | Riepe et al. | 716/9 |
| 2007/0256037 A1* | 11/2007 | Zavadsky et al. | 716/2 |
| 2009/0313596 A1* | 12/2009 | Lippmann et al. | 716/12 |
| 2011/0093827 A1 | 4/2011 | Tsurusaki et al. | |

* cited by examiner

*Primary Examiner* — Thuan Do
*Assistant Examiner* — Mohammed Alam
(74) *Attorney, Agent, or Firm* — Park, Vaughan, Fleming & Dowler LLP; Laxman Sahasrabuddhe (57) ABSTRACT

Systems and techniques for creating a netlist abstraction are described. During operation, an embodiment can receive a netlist for a circuit design, wherein circuit elements in the circuit design are organized in a logical hierarchy (LH). Next, the embodiment can receive a set of LH nodes in the LH. The embodiment can then create the netlist abstraction by, for each LH node in the set of LH nodes, replacing a portion of the netlist that is below the LH node by a star netlist, wherein the star netlist includes a center object that is electrically connected to a set of satellite objects, wherein each satellite object corresponds to a port of the LH node.

18 Claims, 6 Drawing Sheets

NETLIST ABSTRACTION

RELATED APPLICATION

This application claims priority to U.S. Provisional Application Ser. No. 61/747,969, by the same inventors, filed on 31 Dec. 2012, the contents of which are herein incorporated by reference in their entirety.

BACKGROUND

1. Technical Field

This disclosure relates to electronic design automation (EDA). More specifically, this disclosure relates to creating and using a netlist abstraction.

2. Related Art

Advances in process technology and a practically unlimited appetite for consumer electronics have fueled a rapid increase in the size and complexity of integrated circuit (IC) designs. The performance of EDA tools is very important because it reduces the time to market for IC designs. Floorplanning is an important stage in an EDA design flow that involves determining locations for various objects (blocks, modules, circuit elements, etc.) in the IC layout. The quality of the floorplan can significantly impact the overall quality of the final IC layout.

Unfortunately, due to the rapid increase in the size and complexity of IC designs, conventional floorplanning tools can take a very long time to generate floorplans and/or generate poor quality floorplans.

SUMMARY

Some embodiments described herein provide methods and systems for creating a netlist abstraction. The netlist abstraction can then be used to substantially improve the performance and the quality of results of floorplanning operations.

Specifically, an embodiment can receive a netlist for a circuit design, wherein circuit elements in the circuit design are organized in a logical hierarchy. Next, the embodiment can receive a set of logical hierarchy nodes in the logical hierarchy. The embodiment can then create the netlist abstraction by performing the following operation for each logical hierarchy node in the set of logical hierarchy nodes: replace a portion of the netlist that is below the logical hierarchy node by a star netlist, wherein the star netlist includes a center object that is electrically connected to a set of satellite objects, wherein each satellite object corresponds to a port of the logical hierarchy node.

In some embodiments, the nets that electrically connect center objects with satellite objects are assigned a greater weight than nets that electrically connect satellite objects with one another. In some embodiments, each star netlist includes a net that electrically interconnects the set of satellite objects with one another. In some embodiments, a sum of areas of the center object and the set of satellite objects in each star netlist is substantially equal to the area of the logical hierarchy node that corresponds to the star netlist. In some embodiments, the area of the center object in each star netlist is greater than the area of each satellite object in the star netlist.

Once the netlist abstraction is created, placement can be performed on the netlist abstraction to obtain a placed netlist abstraction. Since the size of the netlist abstraction can be substantially smaller than the original netlist (i.e., the non-abstract netlist), the placement operation can quickly generate the placed netlist abstraction from the netlist abstraction.

The placed netlist abstraction can then be used as a seed for one or more floorplanning operations. For example, the embodiment can use the placed netlist abstraction as a seed to perform block shaping and/or macro placement on the circuit design. Creating and using the netlist abstraction in this manner can substantially improve the overall performance and quality of results of floorplanning operations.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of an EDA Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are for illustrative purposes only and are not intended to limit the embodiments to the forms disclosed.

Some EDA software tools enable circuit designers to describe the functionality that the circuit designers want to implement. These tools also enable circuit designers to perform what-if planning to refine functionality, check costs, etc. During logic design and functional verification, the HDL (hardware description language), e.g., SystemVerilog, code can be written and the design can be checked for functional accuracy, e.g., the design can be checked to ensure that it produces the correct outputs.

During synthesis and design for test, the HDL code can be translated to a netlist using one or more EDA software tools.

Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically coupled.

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Netlist Abstraction

A circuit abstraction is a representation of a circuit design that does not include all of the details of the circuit design. Some embodiments described herein create a circuit abstraction that substantially improves the performance of floorplanning operations.

Figure 1:
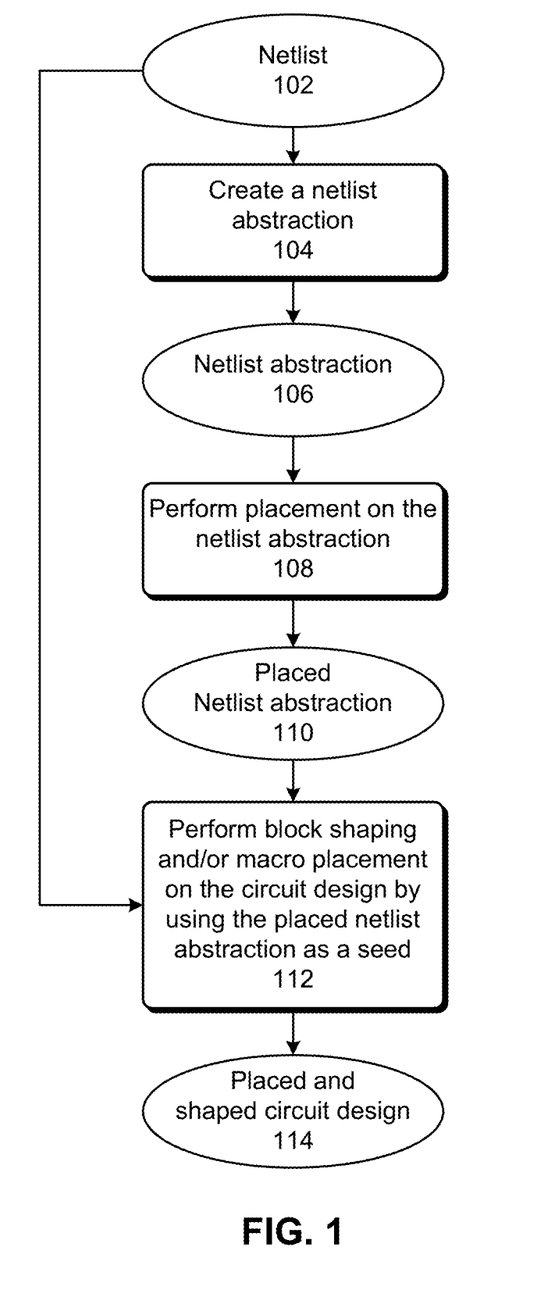
FIG. 1 presents a flowchart that illustrates how a netlist abstraction can be used to improve performance of floorplanning operations in accordance with some embodiments described herein.

FIG. 1 presents a flowchart that illustrates how a netlist abstraction can be used to improve performance of floorplanning operations in accordance with some embodiments described herein. Netlist 102 describes how different circuit elements of a circuit design are electrically connected to one another. A netlist can be viewed as having a set of instances and a set of nets. Each instance can include one or more pins, and each net can electrically connect two or more pins in the netlist. An instance can represent a circuit entity at any abstraction level. For example, an instance can be an electrical component (e.g., a transistor, a resistor, etc.), a gate (e.g., an "AND" gate, an "OR" gate, etc.), a module (e.g., an adder, a memory block, etc.), or any other circuit entity at any other abstraction level.

Netlist abstraction 106 can be created (operation 104) based on netlist 102. Specifically, netlist abstraction 106 can be created based on a logical hierarchy associated with netlist 102. Next, placement can be performed on netlist abstraction 106 (operation 108) to obtain placed netlist abstraction 110. During the placement operation, the placeable objects in netlist abstraction 106 are assigned a location in the circuit design floorplan. Note that netlist abstraction 106 can be significantly smaller in size than netlist 102. Therefore, floorplanning operations (e.g., placement) can be performed significantly faster on netlist abstraction 106 than on netlist 102.

Block shaping and/or macro placement can then be performed on the circuit design (e.g., netlist 102) by using placed netlist abstraction 110 as a seed (operation 112). For example, an initial solution for block shaping and/or macro placement can be quickly generated by placing circuit elements in netlist 102 based on placed netlist abstraction 110. Next, the initial solution can be further optimized to generate placed and shaped circuit design 114. Creating and using the netlist abstraction 106 in this manner can substantially improve the overall performance and quality of results of floorplanning operations that are performed on netlist 102.

Figure 2:
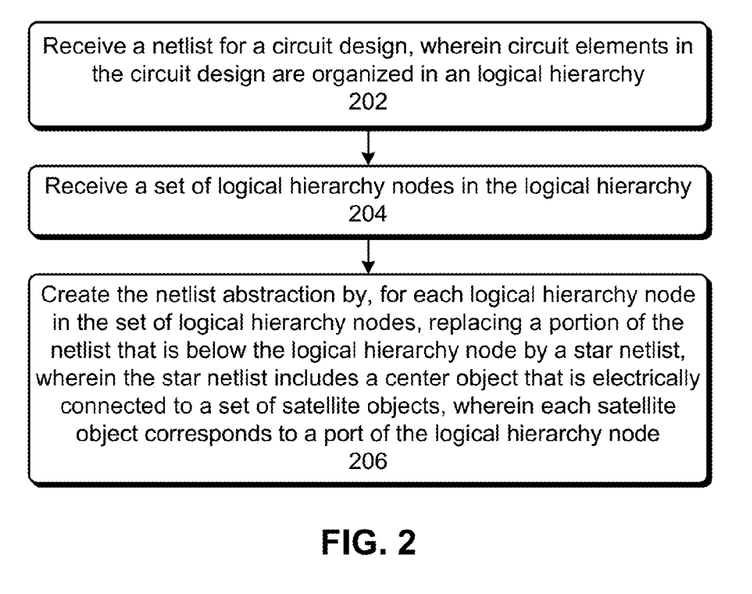
FIG. 2 presents a flowchart that illustrates a process for creating a netlist abstraction in accordance with some embodiments described herein.

FIG. 2 presents a flowchart that illustrates a process for creating a netlist abstraction in accordance with some embodiments described herein. The process can begin with receiving a netlist for a circuit design, wherein circuit elements in the circuit design are organized in a logical hierarchy (operation 202). Next, the process can receive a set of logical hierarchy nodes in the logical hierarchy (operation 204).

For example, a user may provide the set of logical hierarchy nodes to the netlist abstraction tool, e.g., by selecting circuit blocks using a graphical user interface, by providing a list of logical hierarchy node identifiers in a file, etc. Alternatively, the netlist abstraction tool may automatically (i.e., without user input) select the set of logical hierarchy nodes, e.g., based on an area threshold (e.g., the tool may automatically select the lowest logical hierarchy nodes whose areas are greater than the area threshold), a cell count threshold (e.g., the tool may automatically select the lowest logical hierarchy nodes whose cell counts are greater than the cell count threshold), a macro count threshold (e.g., the tool may automatically select the lowest logical hierarchy nodes whose macro counts are greater than the macro count threshold), etc.

The process can then create the netlist abstraction by, for each logical hierarchy node in the set of logical hierarchy nodes, replacing a portion of the netlist that is below the logical hierarchy node by a star netlist, wherein the star netlist includes a center object that is electrically connected to a set of satellite objects, wherein each satellite object corresponds to a port of the logical hierarchy node (operation 206).

Figure 3:
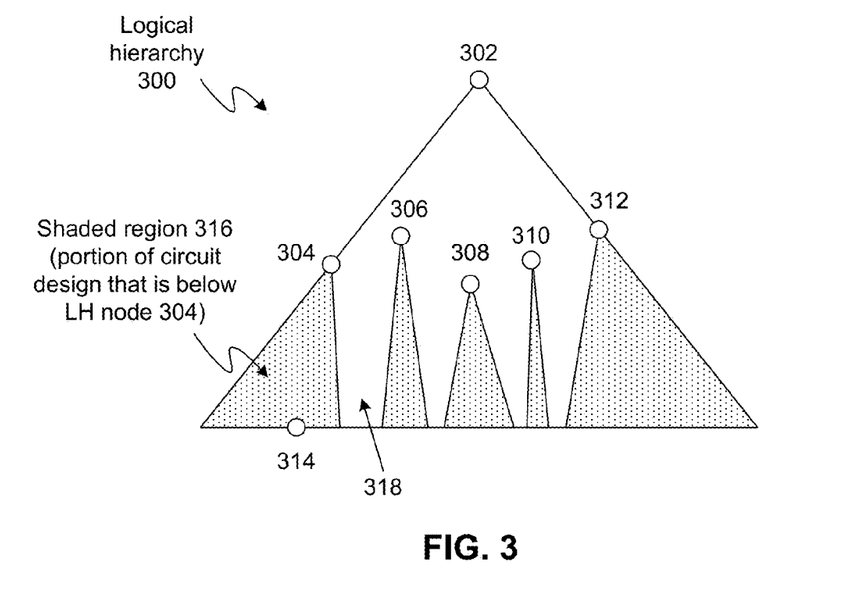
FIG. 3 illustrates a logical hierarchy of a circuit design in accordance with some embodiments described herein.

FIG. 3 illustrates a logical hierarchy of a circuit design in accordance with some embodiments described herein. Logical hierarchy 300 includes logical hierarchy nodes 302-314. Logical hierarchy node 302 can be the top level node that can correspond to either the entire circuit design or to a physical block (e.g., a memory block, a processor block, etc.) in the circuit design. Logical hierarchy nodes 304-312 can correspond to intermediate nodes in logical hierarchy 300, and logical hierarchy node 314 can correspond to a leaf node in logical hierarchy 300. An intermediate-level node in logical hierarchy 300 can correspond to an intermediate-level entity (e.g., a multiplexer, an adder, a register bank, etc.) within the circuit design. Specifically, an intermediate-level node can correspond to a module in an HDL (e.g., SystemVerilog) file that describes the circuit design. A leaf node, e.g., logical hierarchy node 314, can correspond to a basic component of the circuit design, e.g., an inverter.

The shaded regions under logical hierarchy nodes 304-312 correspond to portions of the circuit design netlist that are within each of those logical hierarchy nodes. For example, shaded region 316 corresponds to the portion of the circuit design netlist that is below logical hierarchy node 304. Nodes within shaded region 316 correspond to entities that are part of the circuitry for logical hierarchy node 304. For example, if logical hierarchy node 304 corresponds to an adder module, then shaded region 316 can correspond to the netlist for the adder module, and logical hierarchy node 314 that is within shaded region 316 can correspond to a circuit element (e.g., an inverter) that is in the adder module netlist. The non-shaded regions in logical hierarchy 300 correspond to portions of the netlist that are not within logical hierarchy nodes 304-312. For example, non-shaded region 318 can include circuitry that electrically interconnects a first circuit element in hierarchy node 304 with a second circuit element in hierarchy node 306.

Figure 4A:
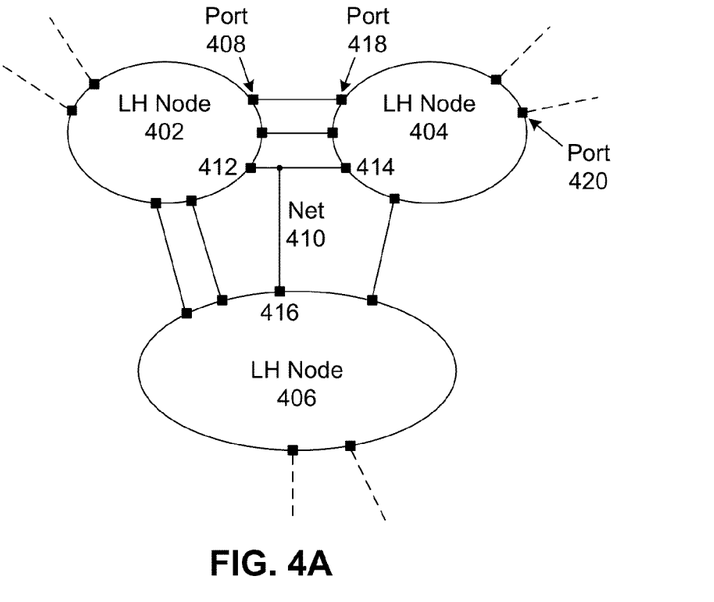
FIG. 4A illustrates a view of a netlist in accordance with some embodiments described herein.

FIG. 4A illustrates a view of a netlist in accordance with some embodiments described herein. The ovals shown in FIG. 4A represent portions of the netlist that correspond to logical hierarchy nodes 402-406. Each oval in FIG. 4A includes one or more dark squares on the oval's boundary. Each of these squares represents a port of the logical hierarchy node. A port can be used to receive a signal from a circuit element that is not within the logical hierarchy node or to provide a signal to a circuit element that is not within the logical hierarchy node. Examples of signals that can be received at a port or that can be provided by a port include, but are not limited to, clock, data, and address signals. Note that a port of a logical hierarchy node can correspond to an input pin or an output pin of a circuit element that is below the logical hierarchy node in the logical hierarchy.

A port of a logical hierarchy node can be electrically connected to ports of other logical hierarchy nodes and/or to other circuit elements in the circuit design. For example, port 408 in logical hierarchy node 402 can be electrically connected to port 418 in logical hierarchy node 404. Likewise, net 410 can be used to electrically connect ports 412, 414, and 416 in logical hierarchy nodes 402, 404, and 406, respectively. Port 420 may be electrically connected to one or more circuit elements that are not in the logical hierarchy nodes shown in FIG. 4A.

Figure 4B:
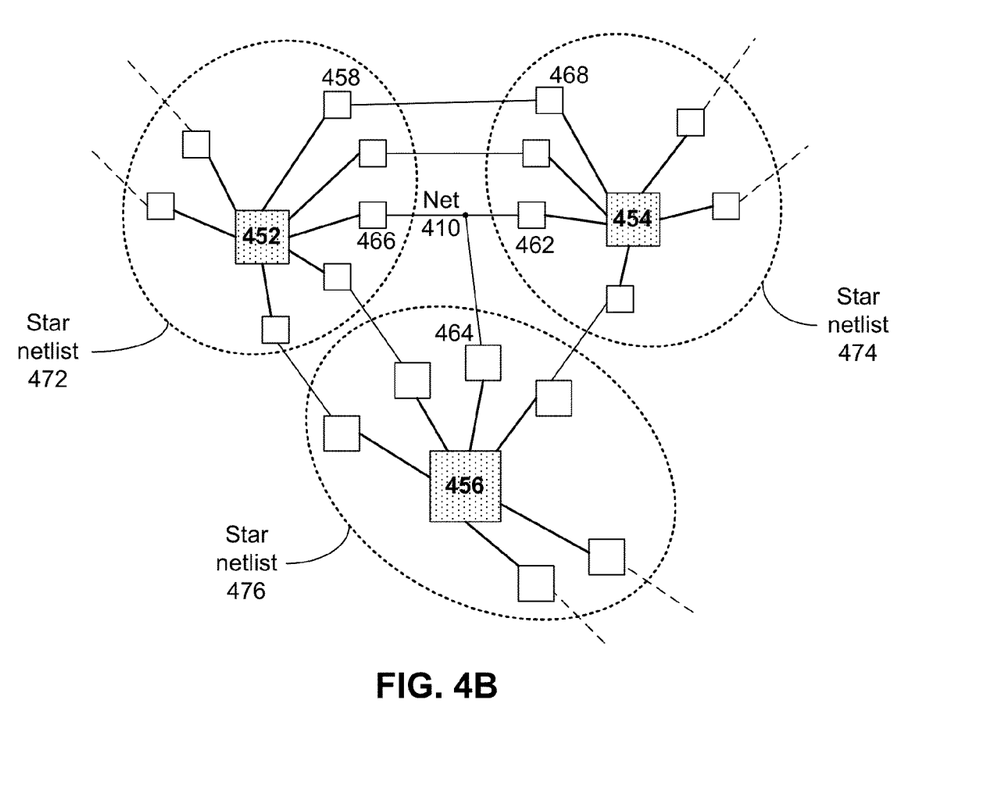
FIG. 4B illustrates how a netlist abstraction can be created from a netlist in accordance with some embodiments described herein.

FIG. 4B illustrates how a netlist abstraction can be created from a netlist in accordance with some embodiments described herein. Given a set of logical hierarchy nodes in a circuit design netlist, a netlist abstraction can be created by performing the following operations for each logical hierarchy node in the set of hierarchy nodes: (1) create a star netlist for the logical hierarchy node, wherein each star netlist includes a center object that is electrically connected to one or more satellite objects, and wherein each satellite object corresponds to a port in the logical hierarchy node, and (2) replace the portion of the netlist below the logical hierarchy node with the star netlist. Note that the star netlist can be substantially smaller in size than the portion of the netlist that the star netlist replaces.

The netlist abstraction shown in FIG. 4B corresponds to the netlist shown in FIG. 4A. Star netlists 472, 474, and 476 correspond to logical hierarchy nodes 402, 404, and 406, respectively. Each star netlist includes a center object (shown as a shaded square in FIG. 4B) that is electrically connected to one or more satellite objects (shown as non-shaded squares in FIG. 4B). For example, center object 452 is electrically connected to satellite objects 458, 466, and five other satellite objects. In the original netlist, logical hierarchy node 402 may have included thousands or millions of circuit elements. Note that, in the netlist abstraction shown in FIG. 4B, the circuit elements (which can be in the thousands or millions) in logical hierarchy node 402 have been replaced by star net list 472 (which includes only eight objects).

The electrical connections that existed in the original netlist between a port of a logical hierarchy node and other ports or circuit elements can be retained in the netlist abstraction. For example, in the original netlist shown in FIG. 4A, an electrical connection existed between port 408 and port 418. This electrical connection is retained in the netlist abstraction shown in FIG. 4B so that satellite object 458 (which corresponds to port 408) is electrically connected to satellite object 468 (which corresponds to port 418).

In some embodiments, the electrical connections between the center object and the satellite object can be assigned a sufficiently high weight so that the placement engine keeps the center object and the satellite objects in proximity to one another during placement. For example, the electrical connection between center object 452 and satellite object 458 can be assigned a weight that is greater than the weight of the electrical connection between satellite objects 458 and 468 (note that the weight of the electrical connection between satellite objects 458 and 468 can be the same as the weight that existed in the original netlist).

A placement engine typically uses a cost function to optimize the placement of circuit elements. Usually, one of the components in the cost function is a weighted sum of the electrical connection lengths (e.g., a weighted sum of the wire lengths of the nets). Therefore, if the electrical connections between the center object and the satellite objects are assigned a greater weight, then the placement engine will try to keep those objects near one another because doing so will help minimize the cost function.

Figure 4C:
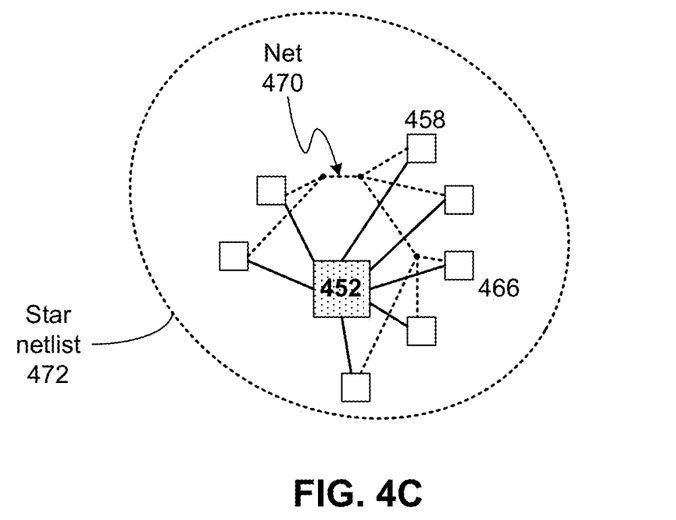
FIG. 4C illustrates a net that electrically interconnects the set of satellite object in a star netlist with one another in accordance with some embodiments described herein.

In some embodiments described herein, a net can be added to the netlist abstraction that electrically interconnects the satellite objects in a star netlist with one another. Adding such a net can ensure that the placement engine keeps the center object and the satellite objects close to one another during placement. FIG. 4C illustrates a net that electrically interconnects the set of satellite object in a star netlist with one another in accordance with some embodiments described herein. As shown in FIG. 4C, net 470 can be added to star netlist 472 to ensure that the placement engine keeps center object 452 and the satellite objects (e.g., satellite objects 458 and 466) close to one another during placement. Note that net 470 (shown using dotted lines in FIG. 4C) electrically interconnects all of the satellite objects with one another.

In some embodiments described herein, the sum of the areas of the center object and the satellite objects in each star netlist is substantially equal to the area of the logical hierarchy node that corresponds to the star netlist. When a placement engine places the star netlist (i.e., places the center object and the satellite objects in the star netlist), the total area covered by the star netlist should correspond to the total area of the circuitry that the star netlist represents. Otherwise, the placement engine may not generate a meaningful output when the placement engine performs placement on the netlist abstraction.

In some embodiments described herein, the area of the center object is greater than the area of each satellite object in each star netlist. Assigning area values to the center object and the satellite objects in this manner can make it easier to visualize the star netlist on a graphical user interface.

In some embodiments described herein, the center objects and the satellite objects appear as "normal" placeable objects to a floorplanning tool. In other words, the floorplanning tool may treat the netlist abstraction just like any other "normal" netlist, and no modifications may be required to the floorplanning tool for handling the netlist abstraction.

The netlist abstraction apparatuses and processes described herein can be used during placement and block shaping at the top level of the floorplan or within a physical block in the floorplan. In some embodiments, the netlist abstraction apparatuses and processes described herein can be used recursively. For example, the netlist abstraction apparatuses and processes can be used during placement and block shaping at the top level of the floorplan. Next, within each block in the resulting top level floorplan, placement and block shaping can be performed by using the netlist abstraction apparatuses and processes described herein. This process can then be repeated for each sub-block within each block, and so forth. In some embodiments, the netlist abstraction apparatuses and processes described herein can be used to create netlist abstractions at multiple levels simultaneously, i.e., a netlist abstraction can be created simultaneously at the top-level, block level, sub-block level, etc. Once created, the netlist abstractions at the multiple levels can be used to simultaneously perform placement and block shaping at the multiple levels.

Figure 5A:
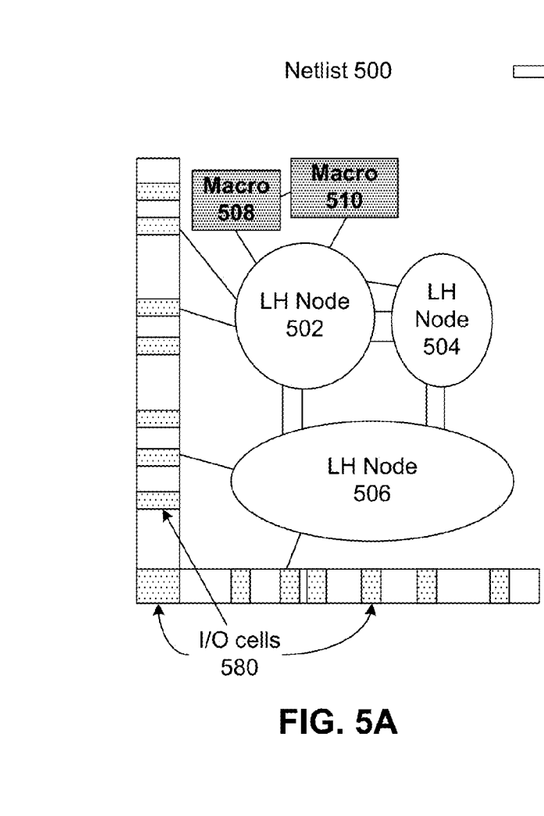
FIGS. 5A-5C illustrate how a netlist abstraction can be used for placement and block shaping in accordance with some embodiments described herein.
Figure 5B:
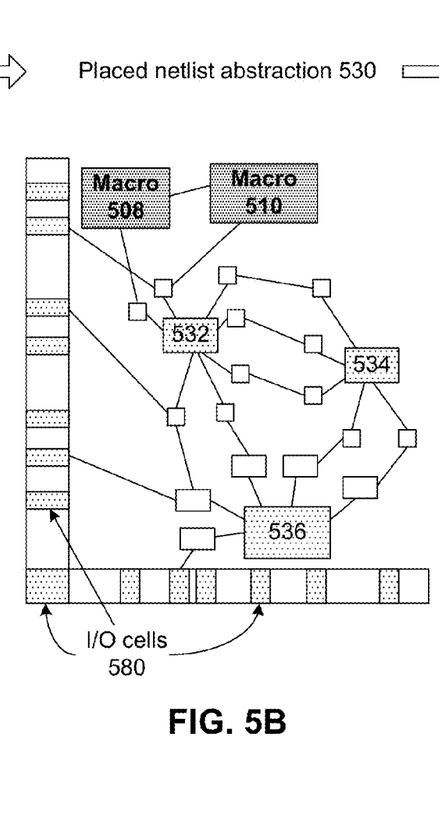
Figure 5C:
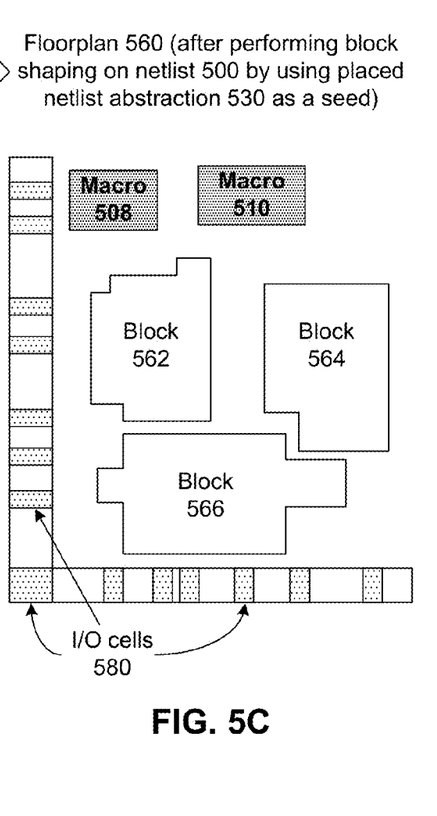

FIGS. 5A-5C illustrate how a netlist abstraction can be used for placement and block shaping in accordance with some embodiments described herein. FIG. 5A illustrates netlist 500 of a circuit design that includes logical hierarchy nodes 502-506, macro cells 508-510, and a plurality of I/O cells (e.g., I/O cells 580). FIG. 5B illustrates placed netlist abstraction 530 that corresponds to netlist 500. Placed netlist abstraction 530 is obtained after a netlist abstraction is created based on netlist 500 and placement is performed on the netlist abstraction. Center objects 532, 534, and 536 in placed netlist abstraction 530 are part of star netlists that correspond to logical hierarchy nodes 502, 504, and 506, respectively, in netlist 500. Placed netlist abstraction 530 can then be used as a seed for performing block shaping on netlist 500. Floorplan 560 includes blocks 562, 564, and 566 which illustrate the result of performing block shaping on netlist 500 by using placed netlist abstraction 530 as a seed.

Computer System

Figure 6:
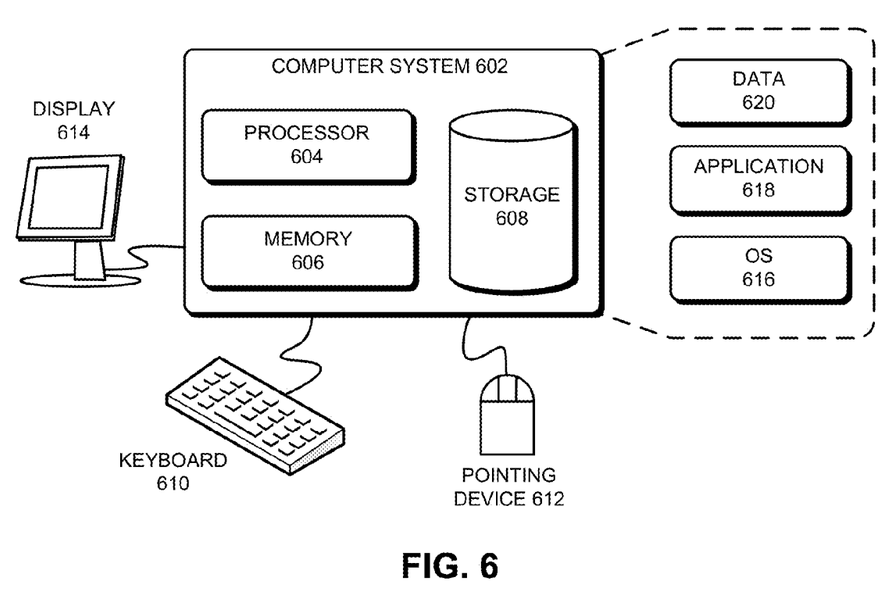
FIG. 6 illustrates a computer system in accordance with some embodiments described in this disclosure.

FIG. 6 illustrates a computer system in accordance with some embodiments described in this disclosure. Computer system 602 can include processor 604, memory 606, and storage device 608. Computer system 602 can be coupled to display device 614, keyboard 610, and pointing device 612. Storage device 608 can store operating system 616, application 618, and data 620. Data 620 can include input required by application 618 and/or output generated by application 618.

Computer system 602 may automatically (or with user intervention) perform one or more operations that are implicitly or explicitly described in this disclosure. For example, computer system 602 can load application 618 into memory 606, and application 618 can then be used to create a netlist abstraction and to perform one or more floorplanning operations that use the netlist abstraction as a seed, thereby substantially improving performance.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for creating a netlist abstraction, the method comprising:
   receiving a netlist for a circuit design, wherein circuit elements in the circuit design are organized in a logical hierarchy (LH);
   receiving a set of LH nodes in the LH;
   creating the netlist abstraction by using a computer, wherein said creating comprises, for each LH node in the set of LH nodes, replacing a portion of the netlist that is below the LH node in the LH by a star netlist, wherein the star netlist includes a center object that is electrically connected to a set of satellite objects, wherein each satellite object corresponds to a port of the LH node; and
   performing placement on the netlist abstraction to obtain a placed netlist abstraction.

2. The method of claim 1, further comprising performing block shaping for the circuit design by using the placed netlist abstraction as a seed.

3. The method of claim 1, further comprising performing macro placement for the circuit design by using the placed netlist abstraction as a seed.

4. The method of claim 1, wherein nets that electrically connect center objects with satellite objects are assigned a greater weight than nets that electrically connect satellite objects with one another.

5. The method of claim 1, wherein each star netlist includes a net that electrically interconnects the set of satellite objects with one another.

6. The method of claim 1, wherein a sum of areas of the center object and the set of satellite objects in each star netlist is substantially equal to the area of the LH node that corresponds to the star netlist.

7. The method of claim 6, wherein in each star netlist, the area of the center object is greater than the area of each satellite object.

8. A non-transitory computer-readable storage medium storing instructions that, when executed by a computer, cause the computer to perform a method for creating a netlist abstraction, the method comprising:
   receiving a netlist for a circuit design, wherein circuit elements in the circuit design are organized in a logical hierarchy (LH);
   receiving a set of LH nodes in the LH;
   creating the netlist abstraction by, for each LH node in the set of LH nodes, replacing a portion of the netlist that is below the LH node in the LH by a star netlist, wherein the star netlist includes a center object that is electrically connected to a set of satellite objects, wherein each satellite object corresponds to a port of the LH node; and
   performing placement on the netlist abstraction to obtain a placed netlist abstraction.

9. The non-transitory computer-readable storage medium of claim 8, wherein the method further comprises performing block shaping for the circuit design by using the placed netlist abstraction as a seed.

10. The non-transitory computer-readable storage medium of claim 8, wherein the method further comprises performing macro placement for the circuit design by using the placed netlist abstraction as a seed.

11. The non-transitory computer-readable storage medium of claim 8, wherein nets that electrically connect center objects with satellite objects are assigned a greater weight than nets that electrically connect satellite objects with one another.

12. The non-transitory computer-readable storage medium of claim 8, wherein each star netlist includes a net that electrically interconnects the set of satellite objects with one another.

13. The non-transitory computer-readable storage medium of claim 8, wherein a sum of areas of the center object and the set of satellite objects in each star netlist is substantially equal to the area of the LH node that corresponds to the star netlist.

14. The method of claim 13, wherein in each star netlist, the area of the center object is greater than the area of each satellite object.

15. A system, comprising:

a processor; and a storage medium storing instructions that, when executed by the processor, cause the system to perform a method for creating a netlist abstraction, the method comprising:

receiving a netlist for a circuit design, wherein circuit elements in the circuit design are organized in a logical hierarchy (LH);

receiving a set of LH nodes in the LH;

creating the netlist abstraction by, for each LH node in the set of LH nodes, replacing a portion of the netlist that is below the LH node in the LH by a star netlist, wherein the star netlist includes a center object that is electrically connected to a set of satellite objects, wherein each satellite object corresponds to a port of the LH node; and performing placement on the netlist abstraction to obtain a placed netlist abstraction.

16. The system of claim 15, wherein the method further comprises:

performing macro placement and block shaping for the circuit design by using the placed netlist abstraction as a seed.

17. The system of claim 15, wherein nets that electrically connect center objects with satellite objects are assigned a greater weight than nets that electrically connect satellite objects with one another.

18. The system of claim 15, wherein a sum of areas of the center object and the set of satellite objects in each star netlist is substantially equal to the area of the LH node that corresponds to the star netlist.

\* \* \* \* \*